United States Patent
Otani et al.

(10) Patent No.: US 9,680,465 B2
(45) Date of Patent: Jun. 13, 2017

(54) SWITCHING CIRCUIT

(71) Applicant: Spansion LLC, Sunnyvale, CA (US)

(72) Inventors: Naoki Otani, Kasugai (JP); Yasushige Ogawa, Kasuga (JP)

(73) Assignee: Cypress Semiconductor Corporation, San Jose, CA (US)

( * ) Notice: Subject to any disclaimer, the term of this patent is extended or adjusted under 35 U.S.C. 154(b) by 350 days.

(21) Appl. No.: 14/464,783

(22) Filed: Aug. 21, 2014

(65) Prior Publication Data

US 2016/0056816 A1 Feb. 25, 2016

(51) Int. Cl.
*H03K 17/687* (2006.01)
*H03K 17/082* (2006.01)

(52) U.S. Cl.
CPC ....... *H03K 17/687* (2013.01); *H03K 17/0822* (2013.01); *H03K 2217/0054* (2013.01)

(58) Field of Classification Search
CPC ........ H03K 5/22; H03K 17/687; H03K 3/284; H03K 17/00; H03K 17/04; G01F 1/00
USPC ...... 73/861.17; 341/136; 307/234, 451, 520, 307/576, 577, 579; 327/437
See application file for complete search history.

(56) References Cited

U.S. PATENT DOCUMENTS

| | | | | |
|---|---|---|---|---|
| 4,760,279 A | * | 7/1988 | Saito et al. | H03K 5/1252 326/21 |
| 5,075,677 A | * | 12/1991 | Meaney | G05F 3/24 327/389 |
| 5,370,000 A | * | 12/1994 | Herwig | G01F 1/60 73/861.17 |
| 7,030,591 B2 | | 4/2006 | Stellberger | |
| 2006/0255852 A1 | * | 11/2006 | O'Donnell | H03K 17/063 327/437 |
| 2007/0159229 A1 | * | 7/2007 | De Haas | H03K 17/6872 327/434 |
| 2011/0089991 A1 | * | 4/2011 | Rangarajan | H03K 17/6872 327/427 |

* cited by examiner

*Primary Examiner* — Jared Fureman
*Assistant Examiner* — Win Htun

(57) ABSTRACT

A switching circuit is provided by using an FET with a low gate-source breakdown voltage. The switching circuit includes a PLDMOS with a gate-source breakdown voltage that is lower than a gate-drain breakdown voltage and an impedance converting circuit coupled to the source of the PLDMOS and configured to output substantially the same voltage as an input voltage from the source of the PLDMOS. An input impedance of the converting circuit is higher than an output impedance thereof. The switching circuit further includes a gate voltage generating circuit configured to switch voltage applied to the gate of the PLDMOS between a first voltage and a second voltage, wherein the first voltage is substantially the same as an input voltage from the converting circuit, and wherein a difference between the first voltage and the second voltage is lower than the gate-source breakdown voltage of the PLDMOS.

20 Claims, 12 Drawing Sheets

SWITCHING CIRCUIT

BACKGROUND

For an analog circuit, an analog switching circuit with a complementary metal oxide semiconductor (CMOS) may be used. It is, however, structurally difficult to use the CMOS at high voltage. Use of a structure able to withstand high voltage dynamically raises manufacturing cost.

Therefore, a laterally diffused metal oxide semiconductor (LDMOS) or an Offset metal oxide semiconductor field effect transistor (MOSFET) may be used to create an analog switching circuit which is used in a circuit at higher voltage. The LDMOS and the Offset MOSFET are structurally able to withstand relatively high voltage between a drain and a gate in comparison with a CMOS. The Offset MOSFET is a MOSFET which has a longer distance between the drain and the gate than the CMOS. However, it is necessary to protect a portion between the source and gate of the LDMOS or the Offset MOSFET to prevent the application of high voltage.

Therefore, for example, in the case of using a p-channel LDMOS (PLDMOS) for a switch, a zener diode may be arranged between the source and the gate to protect the portion between the source and the gate and then a resistor may be arranged between the source and the gate to control current flowing through the resistor in order to control the on/off status of the switch. In this method, however, when the control current flows, the ON resistance of the PLDMOS for use in the switch decreases the source-side voltage relative to the drain-side voltage of the PLDMOS. Accordingly, if it is required that the drain-side voltage equals the source-side voltage, it is inappropriate to use such a switching circuit.

For example, U.S. Pat. No. 7,030,591 discloses a configuration for a control with a MOS, but does not describe the problem which occurs when using an LDMOS or an Offset MOSFET for an analog switching circuit.

SUMMARY

Provided herein is a switching circuit with a field effect transistor (FET) with a low gate-source breakdown voltage.

According to an embodiment, a switching circuit includes a first transistor with a gate-source breakdown voltage that is lower than a gate-drain breakdown voltage. A converter is coupled to the source of the first transistor and configured to output substantially the same voltage as an input voltage from the source. An input impedance of the converter is higher than an output impedance of the converter. A gate voltage generator is configured to switch voltage applied to the gate of the first transistor between a first voltage and a second voltage, wherein the first voltage is substantially the same as an input voltage from the converter, and wherein a difference between the first voltage and the second voltage is lower than the gate-source breakdown voltage of the first transistor.

BRIEF DESCRIPTION OF THE DRAWINGS

The accompanying drawings are incorporated herein and form a part of the specification.

In the drawings, like reference numbers generally indicate identical or similar elements. Additionally, generally, the left-most digit(s) of a reference number identifies the drawing in which the reference number first appears.

DETAILED DESCRIPTION

An embodiment of a switching circuit may comprise a FET with a low gate-source breakdown voltage. A method of implementing the switching circuit is not limited to the embodiments described below. The switching circuit may be implemented in other various forms within the scope of the present disclosure. The present embodiments are merely illustrative in all respects, and should not be interpreted restrictively with respect to a concrete configuration, a size, or the like. Particularly, the following description focuses on a case of implementing the switching circuit by using a PLDMOS as an example of the FET with a low gate-source breakdown voltage. The present disclosure, however, is not limited thereto and the switching circuit may be implemented by using an n-channel LDMOS (NLDMOS), an Offset MOSFET, or the like.

1 Outline

Figure 1:
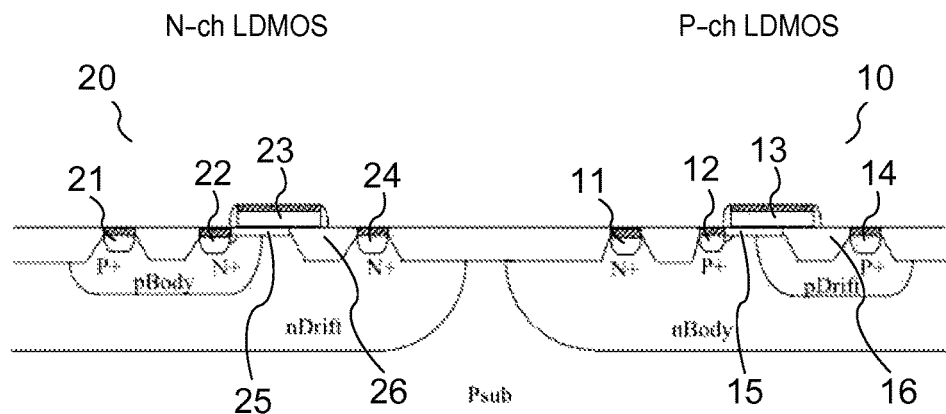
FIG. 1 is a diagram illustrating a configuration of an LDMOS, according to an example embodiment.

First, the configuration of an LDMOS will be described. FIG. 1 is a diagram illustrating an example configuration of a PLDMOS 10 and an example configuration of an NLDMOS 20. The PLDMOS 10 may include a body bias 11, a source 12, a gate 13, and a drain 14. In this respect, a thin source-side gate oxide film 15 exists between the gate 13 and the source 12 and a thick drain-side gate oxide film 16 exists between the gate 13 and the drain 14.

The NLDMOS 20 may include a body bias 21, a source 22, a gate 23, and a drain 24. Similarly to the PLDMOS 10, a thin source-side gate oxide film 25 exists between the gate 23 and the source 22 of the NLDMOS 20 and a thick drain-side gate oxide film 26 exists between the gate 23 and the drain 24.

In this manner, in the PLDMOS 10 and the NLDMOS 20, the drain-side gate oxide films 16 and 26 may be thicker than the oxide film of a 5V transistor. Therefore, even if a 5V or higher voltage (for example, 48V) is applied to a portion between the drain 14 and the gate 13 and a portion between the drain 24 and the gate 23, the portions are not damaged.

The source-side gate oxide films 15 and 25 may have the same thickness as the oxide film of the 5V transistor. Therefore, when a high voltage such as, for example, 48V is applied, an oxide film breakdown occurs. Accordingly, it is necessary to protect the portion between the source 12 and the gate 13 and the portion between the source 22 and the gate 23 such that these portions are not exposed to high voltage. Moreover, it is also necessary to prevent the portion between the body bias 11 and the gate 13 and the portion between the body bias 21 and the gate 23 from being exposed to high voltage. Therefore, in many cases, the source 12 and the source 22 are coupled to the body bias 11 and the body bias 21, respectively.

When making a switch with the PLDMOS 10 and the NLDMOS 20 described above, if a supply voltage is high (for example, 48 V) and if the supply voltage and the ground voltage are applied to the portion between the source and the gate for on/off control, it may be impossible to maintain the breakdown voltage (for example, in the order of 7V) between the source 12 and the gate 13 of the PLDMOS 10 and between the source 22 and the gate 23 of the NLDMOS 20. Therefore, it is necessary to control the gate voltage so as to prevent the source-side gate oxide films 15 and 25 from being damaged and to enable the switching operation. Accordingly, it may be appropriate to construct a switching circuit as illustrated in FIG. 2.

Figure 2:
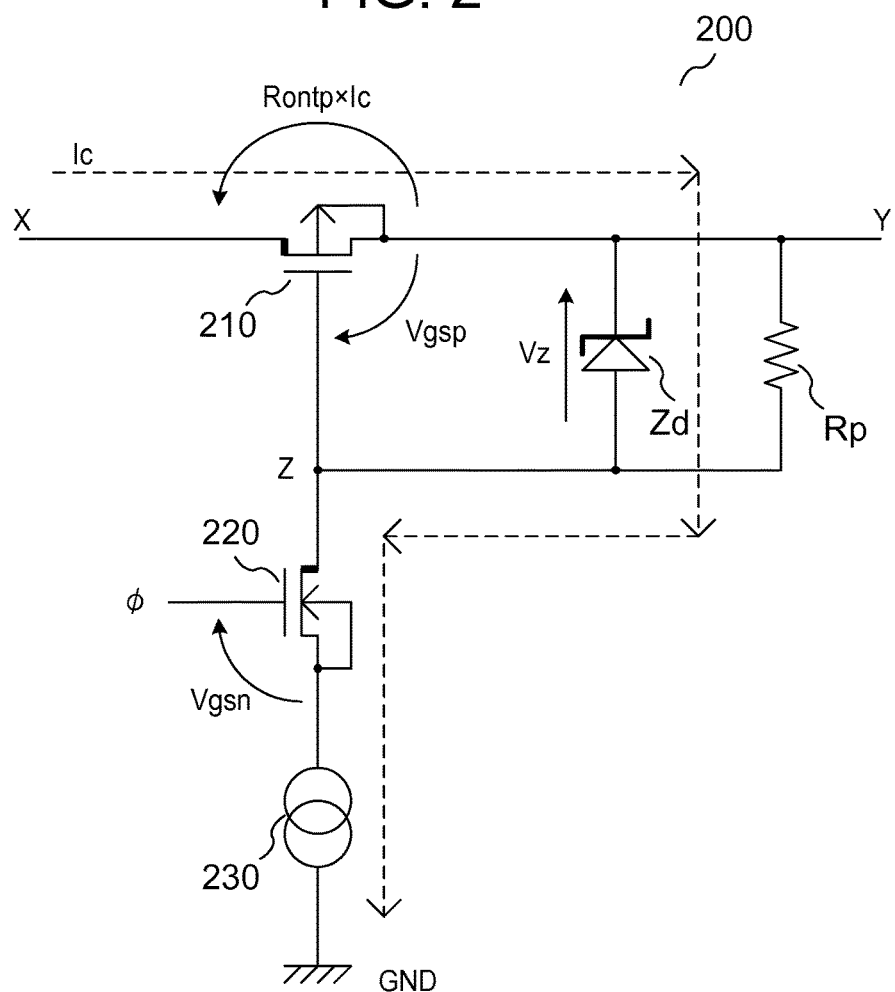
FIG. 2 is a diagram illustrating a switching circuit in which a PLDMOS is used as a switch, according to an example embodiment.

FIG. 2 is an example of a switching circuit 200 in which a PLDMOS 210 may be used as a switch. The switching circuit 200 is configured to switch the on/off status between a node X and a node Y by using the PLDMOS 210. The drain of the PLDMOS 210 and the source thereof are coupled to the node X and the node Y, respectively. In this respect, the gate-source voltage of the PLDMOS 210 is indicated by Vgsp.

In the switching circuit 200, a portion between the gate and the source of the PLDMOS 210 is coupled to each other by a zener diode Zd, and a resistor Rp coupled in parallel. A voltage across both ends of the zener diode Zd and of the resistor Rp is indicated by Vz.

The gate of the PLDMOS 210 may be grounded via an NLDMOS 220 and a current source 230 through which a current Ic flows. In this respect, the node coupled to the gate of the PLDMOS 210, the anode of the zener diode Zd, one end of the resistor Rp, and the drain of the NLDMOS 220 is referred to as node Z. The source of the NLDMOS 220 is coupled to the current source 230 and a control signal ϕ is input to the gate of the NLDMOS 220.

Hereinafter, three problems of the switching circuit 200 will be described. Although this specification describes the circuit configuration and the problems by giving an example of the PLDMOS 210 used as a switch, the same problems occur in the case where the NLDMOS is used as a switch.

1.1 Problem 1

When the NLDMOS 220 is turned on by the control signal ϕ applied to the gate of the NLDMOS 220, the current Ic flows from the node X side to the ground via the PLDMOS 210, the zener diode Zd and the resistor Rp, the NLDMOS 220, and the current source 230. This causes a potential difference Vz between both ends of the zener diode Zd and of the resistor Rp, by which the PLDMOS 210 is turned on. Moreover, in the case where the PLDMOS 210 has an ON resistance Rontp, the current Ic causes a voltage drop of Rontp×Ic between the drain side and the source side of the PLDMOS 210. This causes the voltage of the node Y to be lower than the voltage of the node X. In the case where there is an element or a circuit which is required to transmit the voltage of the node X to the node Y accurately, such as a sample-and-hold circuit coupled over the node Y, the voltage drop decreases the accuracy of the voltage required by the element or the circuit.

1.2 Problem 2

Figure 3:
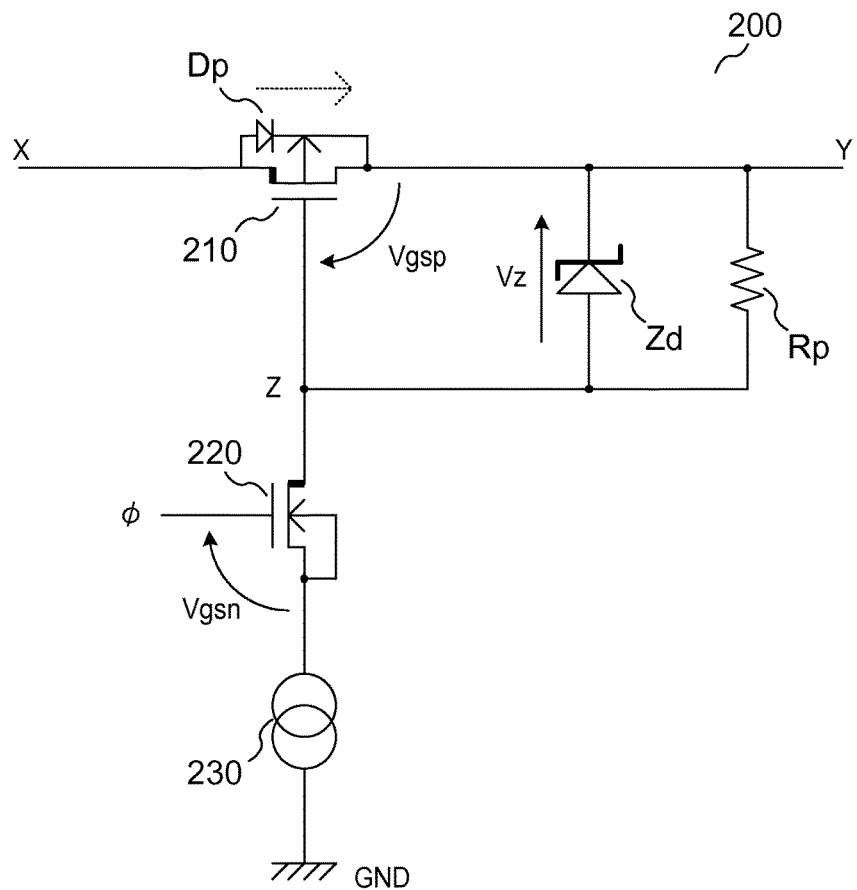
FIG. 3 is a diagram for describing a problem of the switching circuit illustrated in FIG. 2.

The following describes the second problem of the switching circuit 200. The LDMOS structurally may have a parasitic diode. FIG. 3 is illustrates a parasitic diode Dp of the PLDMOS 210 in the switching circuit. The drain of the PLDMOS 210 serves as the anode of the parasitic diode Dp and the body bias of the PLDMOS 210 serves as the cathode of the parasitic diode Dp. The body bias is coupled to the source of the PLDMOS 210 and therefore the cathode of the parasitic diode Dp is coupled to the node Y. Therefore, when the potential of the node X is higher than the potential of the node Y by a degree exceeding the threshold voltage of the parasitic diode Dp, current flows into the parasitic diode Dp. In other words, the parasitic diode Dp may prevent the PLDMOS 210 from turning off the circuit as a switch. Accordingly, to reliably inhibit current from flowing through the parasitic diode Dp, the potential of the node Y needs to be higher than the potential of the node X.

Figure 4:
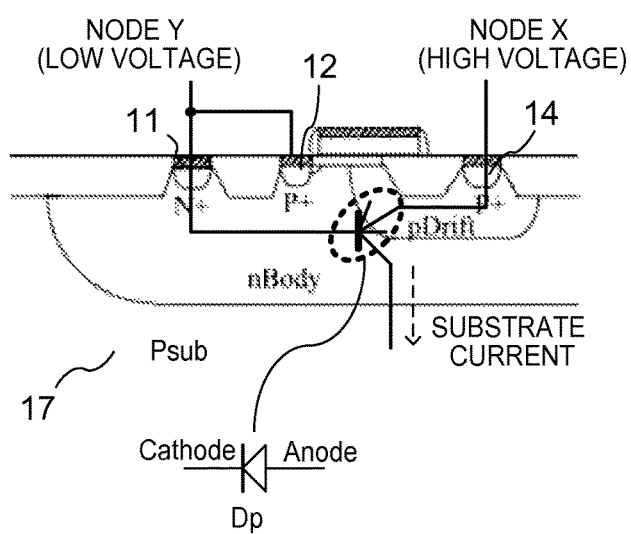
FIG. 4 is a diagram for describing a problem of the switching circuit illustrated in FIG. 2.

Moreover, when the current flows into the parasitic diode Dp, as illustrated in FIG. 4, the current serves as the base current of a parasitic PNP transistor which is composed of the drain 14, the body bias 11, and a substrate 17 and the parasitic PNP transistor is turned on. As a result, the current flows toward the substrate 17 from the node X. The occurrence of the current flowing into the substrate 17 increases current consumption and a latch-up risk.

1.3 Problem 3

Figure 5:
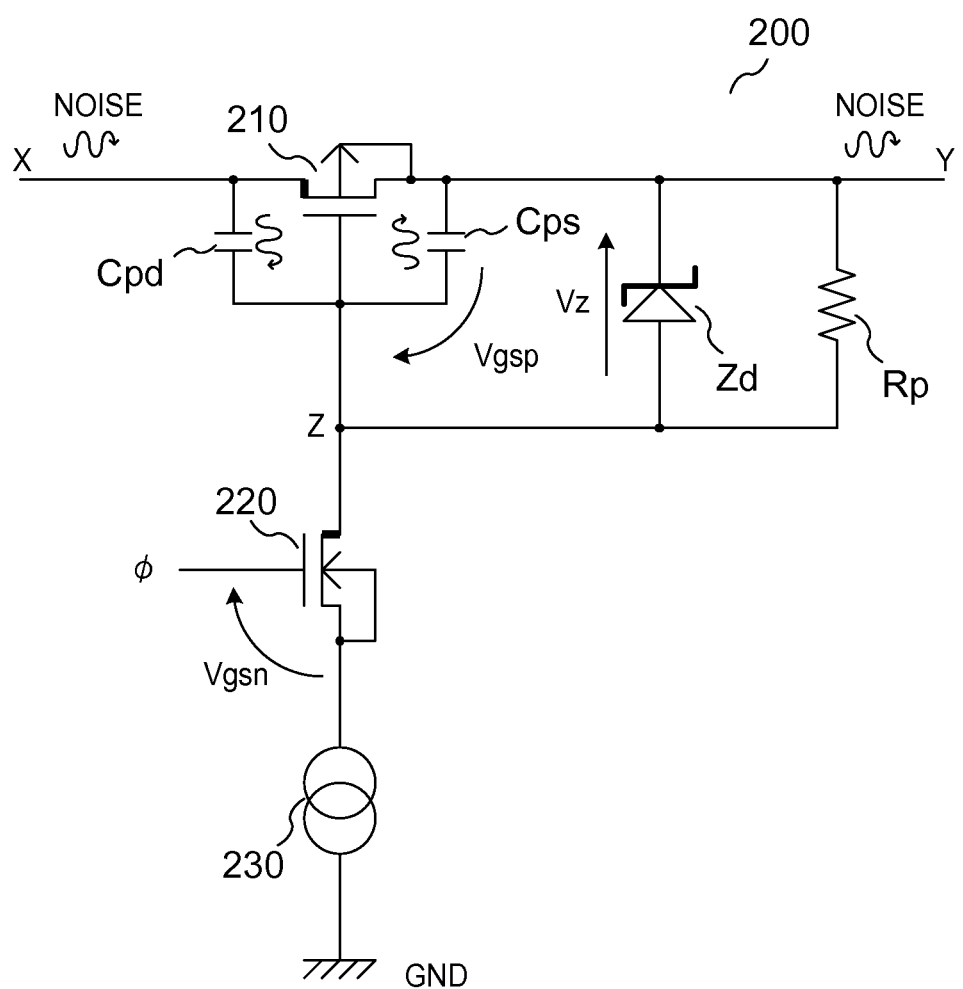
FIG. 5 is a diagram for describing a problem of the switching circuit illustrated in FIG. 2.

The following describes the third problem of the switching circuit 200. The LDMOS structurally may include some parasitic capacitance for a gate oxide film. FIG. 5 is a diagram illustrating parasitic capacitances Cpd and Cps of the PLDMOS 210. In this respect, Cpd indicates the drain-side parasitic capacitance of the PLDMOS 210 and Cps indicates the source-side parasitic capacitance. The parasitic capacitance Cpd is coupled at one end to the node X and coupled at the other end to the node Z. The parasitic capacitance Cps is coupled at one end to the node Y and coupled at the other end to the node Z.

According to the path from the node X to the node Y on the switching circuit 200, the parasitic capacitance Cpd and the parasitic capacitance Cps are coupled in series. In other words, the node X is coupled to the node Y by capacitive coupling. If high-frequency noise happens to be mixed in the node X, the high-frequency noise may propagate to the node Y via the capacitive coupling.

2 Circuit Configuration 2.1 Switching Circuit for Solving Problem 1

Figure 6:
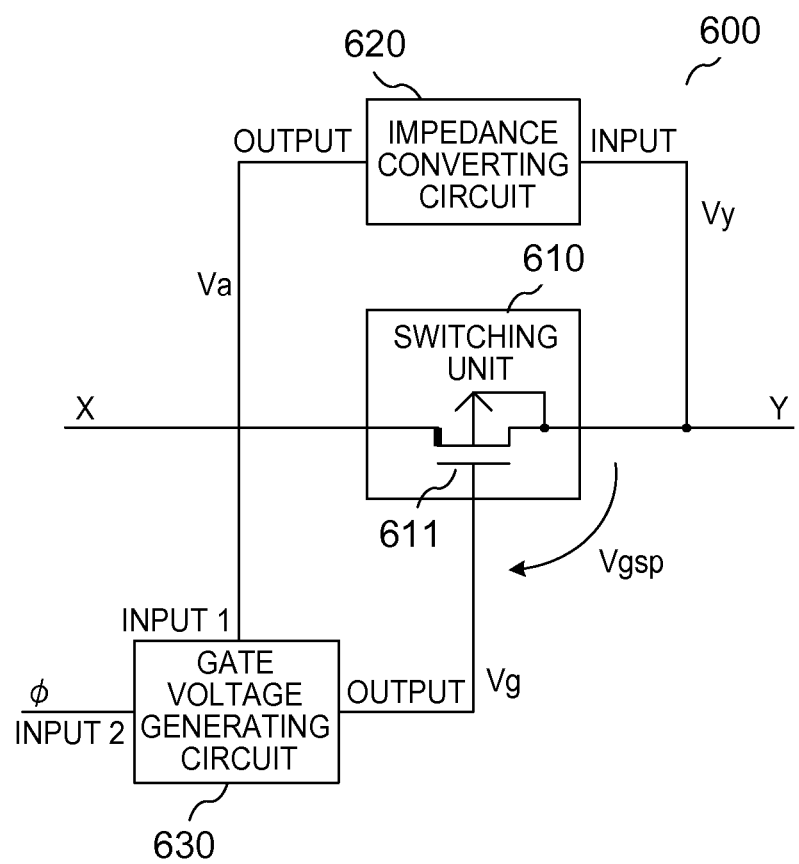
FIG. 6 is a diagram illustrating a configuration of a switching circuit, according to an example embodiment.

Hereinafter, first, a configuration example of a switching circuit 600 that may solve the above problem 1 will be described with reference to FIG. 6. The switching circuit 600 illustrated in FIG. 6 may include a switching unit 610, an impedance converting circuit 620, and a gate voltage generating circuit 630.

The switching unit 610 may comprise a PLDMOS 611 and may be configured to switch the on/off status between the node X and the node Y according to a voltage Vg applied to the gate of the PLDMOS 611. The drain of the PLDMOS 611 is coupled to the node X and the source of the PLDMOS 611 is coupled to the node Y.

An impedance converting circuit 620 may have a high-impedance input terminal and a low-impedance output terminal. The input terminal is coupled to the node Y and the output terminal is coupled to a gate voltage generating circuit 630. With Vy indicating the voltage of the input terminal (the voltage of the node Y) of the impedance converting circuit 620 and Va indicating the voltage of the output terminal of the impedance converting circuit 620, the impedance converting circuit 620 is configured such that the voltage Vy has substantially the same value as the voltage Va (Vy≈Va). Moreover, the impedance converting circuit 620 may be configured to substantially inhibit current from flowing through its input terminal.

An example of the impedance converting circuit 620 is a voltage follower, a source follower, or the like. An example, in which a voltage follower or a source follower is used for the impedance converting circuit 620 will be described later with reference to FIGS. 7, 8A and 8B.

The gate voltage generating circuit 630 may be used to generate the voltage Vg which is an output signal for switching the on/off status of the switching unit 610. The gate voltage generating circuit 630 accepts the output voltage Va from the impedance converting circuit 620 and the control signal ϕ. According to these inputs, the gate voltage generating circuit 630 generates the voltage Vg and outputs the voltage Vg to the gate of the PLDMOS 611.

In this respect, if the control signal ϕ is off, the gate voltage generating circuit 630 is configured such that the voltage Vg has substantially the same value as the voltage Va (Va≈Vg). As described above, the input voltage Vy and the output voltage Va of the impedance converting circuit 620 have substantially the same value. Therefore, if the control signal ϕ is off, Vy≈Vg. In other words, the potential Vy of the source of the PLDMOS 611 substantially coincides with the potential Vg of the gate of the PLDMOS 611. Specifically, the potential difference Vgsp between them is substantially zero.

Moreover, if the control signal ϕ is on, the voltage Vg has a value which is lower than the voltage Va by the voltage Vz. In other words, Vg=Va−Vz. As described above, the input voltage Vy and the output voltage Va of the impedance converting circuit 620 have substantially the same value. Therefore, if the control signal ϕ is on, the potential difference Vgsp between the potential Vy of the source of the PLDMOS 611 and the potential Vg of the gate of the PLDMOS 611 is substantially the same as the voltage Vz.

Therefore, the gate voltage generating circuit 630 may be designed such that the voltage Vz is less than the voltage that may damage the source-side gate oxide film of the PLDMOS 611.

Figure 7:
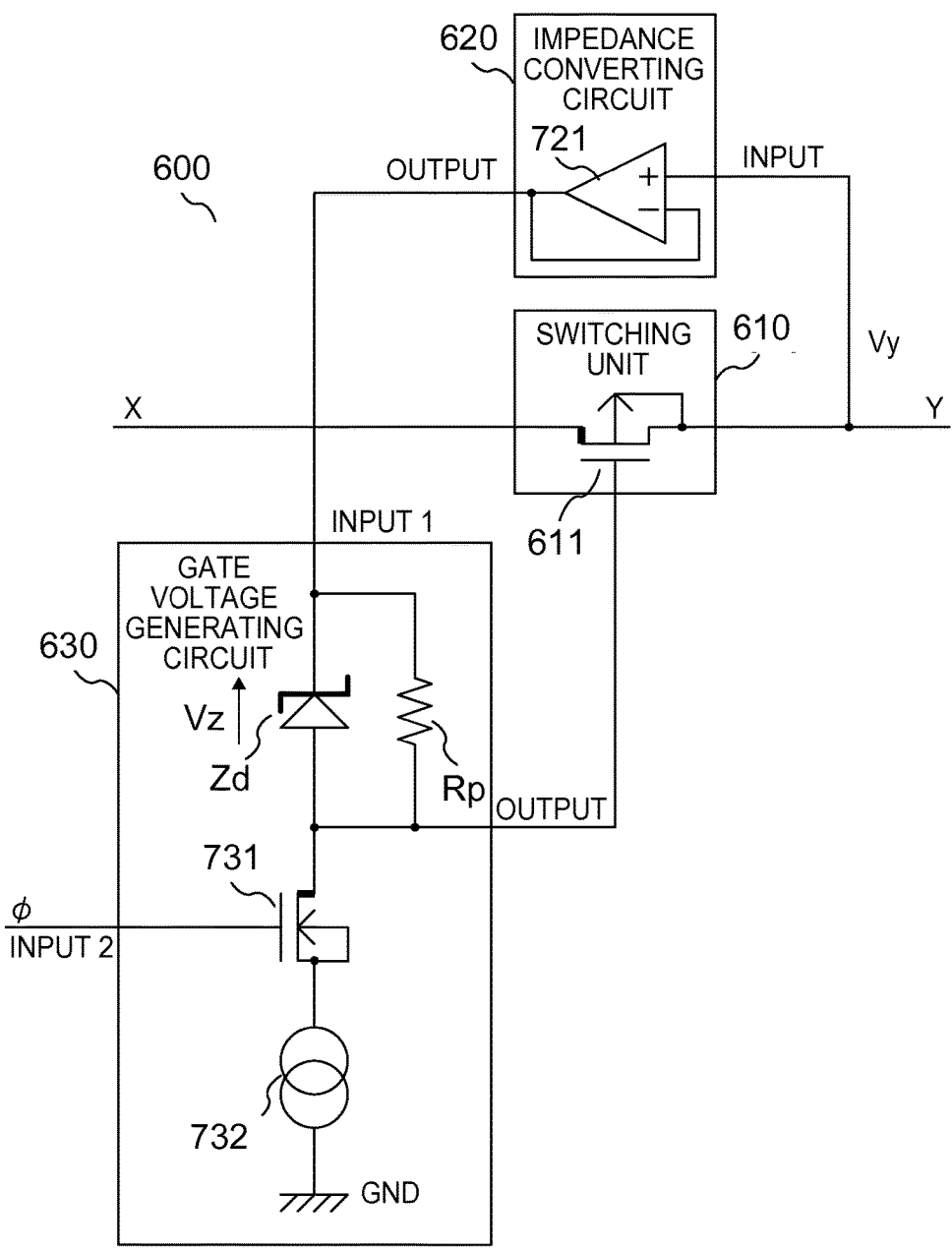
FIG. 7 is a diagram illustrating a configuration of a switching circuit, according to an example embodiment.

Hereinafter, configuration examples of the impedance converting circuit 620 and the gate voltage generating circuit 630 will be described with reference to FIGS. 7, 8A and 8B. FIG. 7 is a diagram illustrating a configuration example of the switching circuit 600 illustrated in FIG. 6.

In the example of FIG. 7, the impedance converting circuit 620 may be implemented as a voltage follower. The voltage Vy is inputted to a non-inverting input terminal of an operational amplifier 721. An inverting input terminal is coupled to an output of the operational amplifier 721 and the output terminal of the impedance converting circuit 620.

The gate voltage generating circuit 630 may include a zener diode Zd, a resistor Rp, a NLDMOS 731, and a current source 732.

The input terminal (input 1), on the side of the impedance converting circuit 620, of the gate voltage generating circuit 630 is coupled to the cathode of the zener diode Zd and to one end of the resistor Rp. The anode of the zener diode Zd and the other end of the resistor Rp are coupled to the drain of the NLDMOS 731 and to the output terminal of the gate voltage generating circuit 630.

The source of the NLDMOS 731 may be grounded via a current source 732. Moreover, the gate of the NLDMOS 731 accepts an input of the control signal ϕ.

The configuration of the switching circuit 600 in FIG. 7 is equivalent to the configuration where the impedance converting circuit 620 is disposed between the node Y and the zener diode Zd and the resistor Rp in the switching circuit configuration illustrated in FIG. 2. The insertion of the impedance converting circuit 620 separates the switching unit 610 from the gate voltage generating circuit 630, which thereby prevents a voltage drop between the node X and the node Y which may be caused by the ON resistance of the PLDMOS 611 and the drive current of the switching unit 610. Consequently, the above problem 1 may be solved.

Figure 8A:
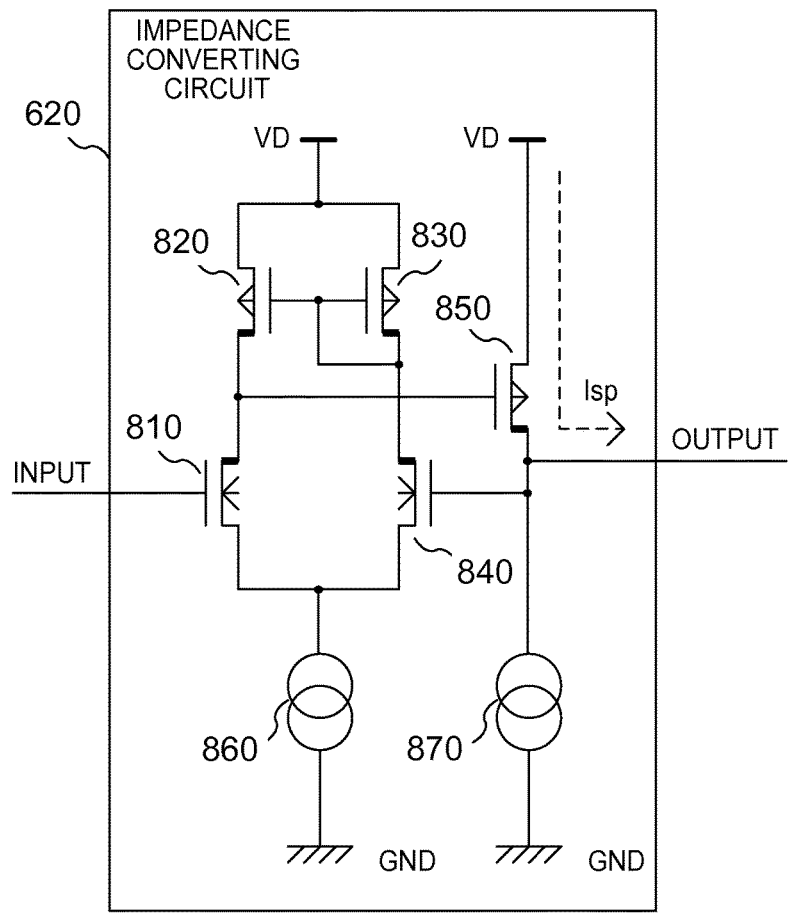
FIG. 8A is a diagram illustrating a configuration of an impedance converting circuit, according to an example embodiment.
Figure 8B:
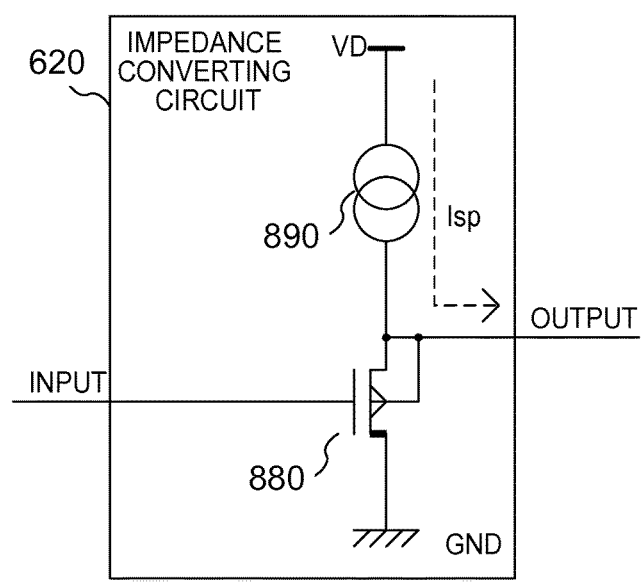
FIG. 8B is a diagram illustrating a configuration of an impedance converting circuit, according to an example embodiment.

FIG. 8A illustrates, according to an embodiment, a circuit configuration example of the impedance converting circuit 620, which may be implemented as a voltage follower. In the example of FIG. 8A, the impedance converting circuit 620 may include NMOS transistors 810 and 840, PMOS transistors 820, 830, and 850, and current sources 860 and 870.

The input terminal of the impedance converting circuit 620 is coupled to the gate of the NMOS transistor 810. The drain of the NMOS transistor 810 is coupled to the drain of the PMOS transistor 820 and to the gate of the PMOS transistor 850. The source of the NMOS transistor 810 is coupled to the source of the NMOS transistor 840 and grounded via the current source 860.

The source of the PMOS transistor 820 is coupled to the source of the PMOS transistor 830 and to the operating voltage VD. Moreover, the gate of the PMOS transistor 820 is coupled to the gate of the PMOS transistor 830 and coupled to the drain of the PMOS transistor 830 and to the drain of the NMOS transistor 840.

The source of the PMOS transistor 850 is coupled to the operating voltage VD. Moreover, the drain of the PMOS transistor 850 is coupled to the output terminal of the impedance converting circuit 620, the gate of the NMOS transistor 840, and the current source 870. The current source 870 is coupled at one end to the PMOS transistor 850 and grounded at the other end.

According to the above configuration, current may not flow into the input terminal of the impedance converting circuit 620. Moreover, in the case where current Isp flows into the output terminal of the impedance converting circuit 620, the current Isp is supplied via the PMOS transistor 850 from the operating voltage VD.

As described above, the impedance converting circuit 620 may also be implemented by a source follower. FIG. 8B is a diagram illustrating an example of implementing the impedance converting circuit 620 by using a source follower. The impedance converting circuit 620 in FIG. 8B may include the PMOS transistor 880 and the current source 890.

The input terminal of the impedance converting circuit 620 is coupled to the gate of the PMOS transistor 880. The drain of the PMOS transistor 880 is grounded. The source of the PMOS transistor 880 is coupled to the output terminal of the impedance converting circuit 620 and to the current source 890. The current source 890 is coupled at one end to the source of the PMOS transistor 880 as described above and to the output terminal of the impedance converting circuit 620 and coupled at the other end to the operating voltage VD.

This configuration inhibits the current from flowing through the input terminal of the impedance converting circuit 620. Moreover, if the current Isp flows into the output terminal of the impedance converting circuit 620, the current Isp is supplied from the operating voltage VD via the current source 890.

2.2 Switching Circuit for Solving Problem 2

Figure 9:
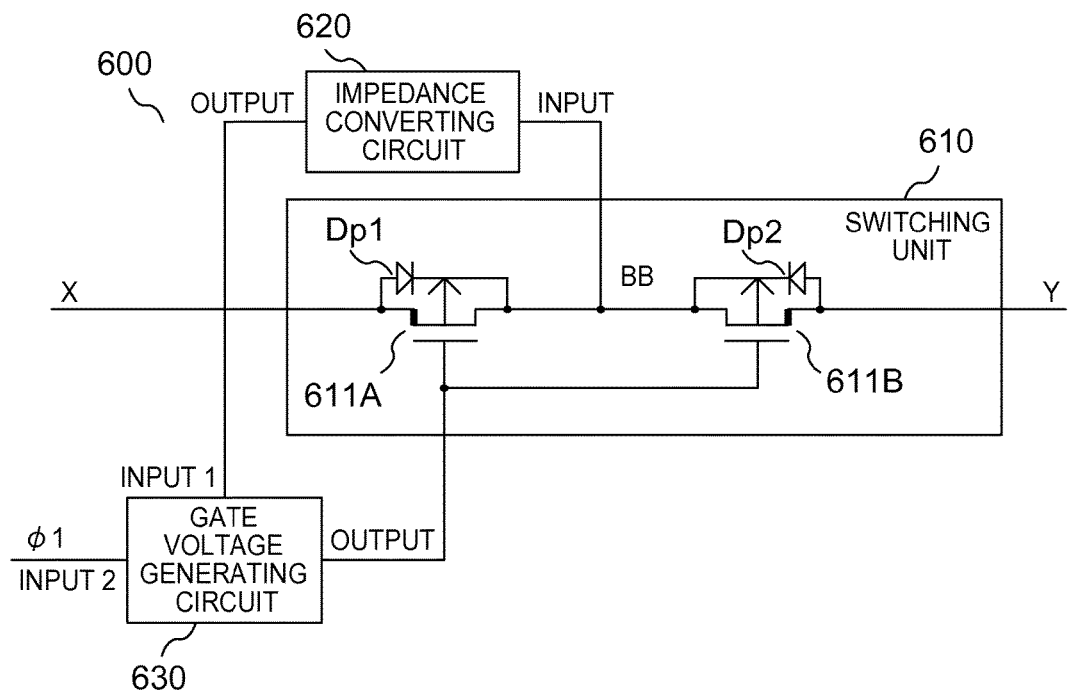
FIG. 9 is a diagram illustrating a switching circuit configuration, according to an example embodiment.

According to an embodiment, a configuration example of the switching circuit 600 for solving the problem 2 in addition to the above problem 1 will be described with reference to FIG. 9. Although the general configuration of the switching circuit 600 illustrated in FIG. 9 is the same as one illustrated in FIG. 6, the configuration of the switching unit 610 is different between them. While the switching unit 610 in FIG. 6 comprises one PLDMOS 611, the switching unit 610 in the example of FIG. 9 may include two PLDMOSs 611A and 611B having the substantially similar property. Note here that the respective parasitic diodes of the PLDMOS 611A and the PLDMOS 611B are indicated by Dp1 and Dp2.

In the example of FIG. 9, the drain of the PLDMOS 611A and the drain of the PLDMOS 611B are coupled to the node X and the node Y, respectively. Moreover, the source and body bias of the PLDMOS 611A are coupled at node BB to the source and body bias of the PLDMOS 611B and to the input terminal of the impedance converting circuit 620. The gate of the PLDMOS 611A and the gate of the PLDMOS 611B are coupled to the output terminal of the gate voltage generating circuit 630.

In the switching circuit 600 illustrated in FIG. 9, the PLDMOSs 611A and 611B are coupled in series and in reverse between the node X and the node Y. Thereby, the parasitic diode Dp1 included in the PLDMOS 611A and the parasitic diode Dp2 included in the PLDMOS 611B are also mutually in reverse. Consequently, current does not flow through the parasitic diodes Dp1 and Dp2 independently of the voltage relation between the node X and the node Y, thereby solving the above problem 2.

Although the PLDMOSs 611A and 611B constituting the switching unit 610 illustrated in FIG. 9 may be implemented by combining two PLDMOSs 10 illustrated in FIG. 1 for example, the present invention is not limited thereto. For example, the PLDMOSs 611A and 611B can be implemented as illustrated in FIG. 10.

Figure 10:
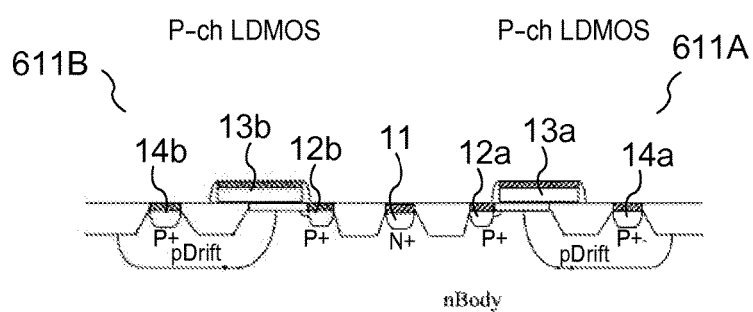
FIG. 10 is a diagram illustrating a configuration of the PLDMOS illustrated in FIG. 9, according to an example embodiment.

In the example of FIG. 10, the PLDMOS 611A has a source 12a, a gate 13a, and a drain 14a and the PLDMOS 611B has a source 12b, a gate 13b, and a drain 14b with the body bias 11 shared between the PLDMOSs 611A and 611B.

This structure enables the configuration, where the PLDMOSs 611A and 611B are coupled in reverse and in series, to be implemented in a small area.

2.3 Switching Circuit for Solving Problem 3

According to an embodiment, a configuration example of the switching circuit 600 for solving the problem 3 in addition to the above problems 1 and 2 will be described with reference to FIG. 11. A difference between the switching circuit 600 in FIG. 11 and the switching circuit 600 in FIG. 9 is the a switching unit 1140.

Figure 11:
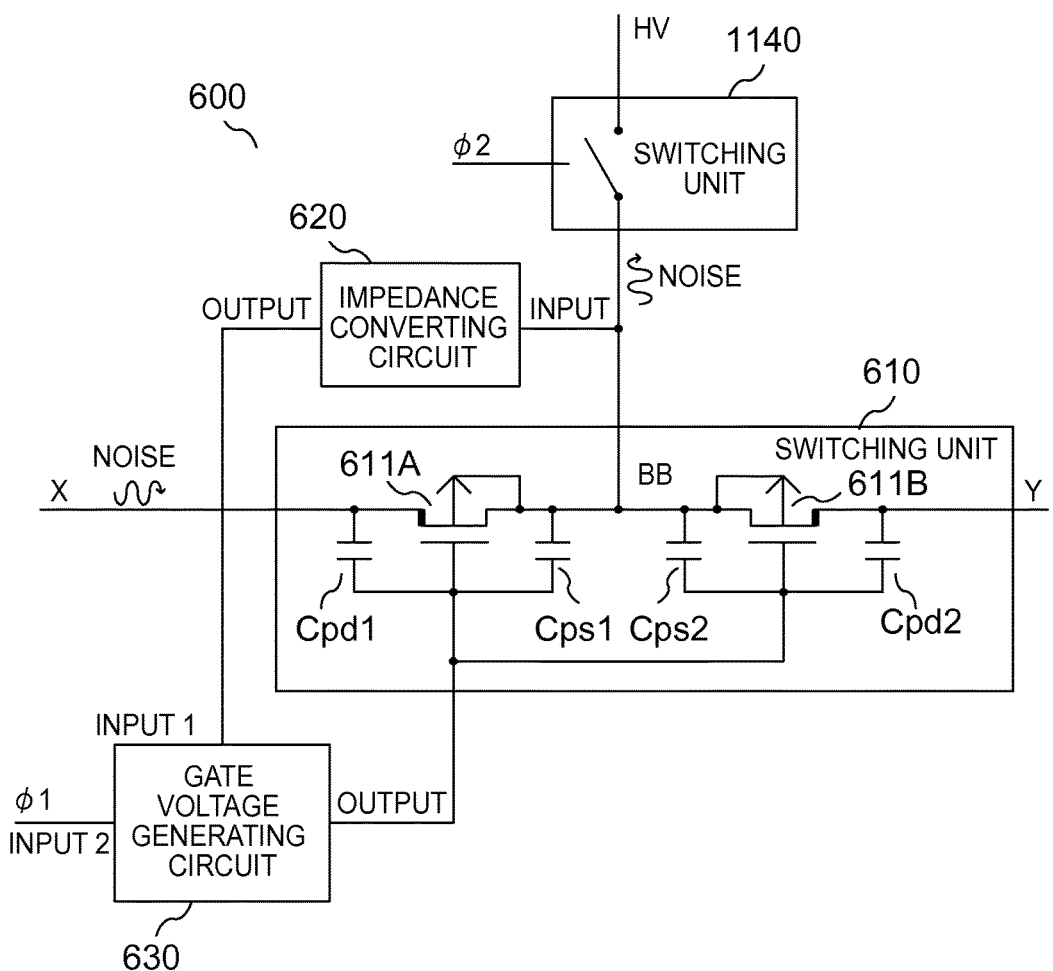
FIG. 11 is a diagram illustrating a switching circuit configuration, according to an example embodiment.

FIG. 11 illustrates parasitic capacitances of the PLDMOSs 611A and 611B in order to describe the problem 3. For example, Cpd1, Cps1, Cpd2, and Cps2 may indicate a parasitic capacitance included on the drain-side in the PLDMOS 611A, a parasitic capacitance included on the source-side in the PLDMOS 611A, a parasitic capacitance included on the drain-side in the PLDMOS 611B, and a parasitic capacitance included on the source-side in the PLDMOS 611B, respectively.

The switching unit 1140 may switch the on/off status of the connection between a voltage source HV and the node BB of the switching unit 610 according to the input of the control signal ϕ2. The voltage source HV is a source of the voltage higher than the voltage of the node X and low in impedance. Herein, ϕ1 indicates an on/off control signal inputted to the gate voltage generating circuit 630 and ϕ2 indicates an on/off control signal inputted to the switching unit 1140.

Figure 12:
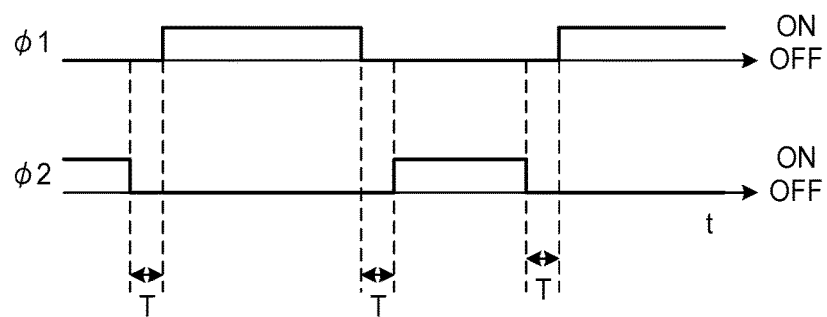
FIG. 12 is a diagram illustrating a timing chart of an on/off control signal inputted to the switching circuit illustrated in FIG. 11, according to an example embodiment.

The control signal ϕ1 inputted to the gate voltage generating circuit 630 and the control signal ϕ2 inputted to the switching unit 1140 do not overlap. FIG. 12 illustrates an example of a timing chart of the control signal ϕ1 and the control signal ϕ2.

In the example of FIG. 12, the control signal ϕ2 is set off when the control signal ϕ1 is set on, while the control signal ϕ1 is set off when the control signal ϕ2 is set on. A non-overlap time T may be provided such that both of the control signals ϕ1 and ϕ2 are set off between the timing at which the control signal ϕ1 is set on and the timing at which the control signal ϕ2 is set on. The non-overlap time T is provided to prevent the voltage of the node Y and the voltage of the node X from being affected by simultaneous turning on of the switching unit 610 and the switching unit 1140.

Therefore, the switching unit 610 and the switching unit 1140 may not be placed in a conductive state simultaneously. Moreover, when the switching unit 610 is turned off, the node BB is connected to the high-voltage and low-impedance voltage source HV. Thereby, the high-frequency noise propagating through the parasitic capacitances Cpd1 and Cps1 from the node X propagates in a direction of the voltage source HV. This prevents the high-frequency noise from propagating to the node Y via the parasitic capacitances Cps2 and Cpd2.

There may be various concrete configurations of the switching unit 1140. For example, the configuration of the switching circuit 200 illustrated in FIG. 2 may be applied to the switching unit 1140 or the configuration in FIG. 7 or 9 may be applied to the switching unit 1140.

3 Other Configuration Examples

Although the above description has been made focusing on an example where the switch in the switching circuit is implemented by using a PLDMOS, the present invention is not limited thereto, and the same circuit may be implemented by using an NLDMOS. Moreover, it is also possible to couple a circuit in which the PLDMOS is used as a switch and a circuit in which the NLDMOS is used as a switch in parallel. The PLDMOS operates preferably with respect to a relatively high voltage, while the NLDMOS operates preferably with respect to a relatively low voltage. Therefore, it is possible to make a switch with low ON resistance at high to low voltages by coupling the circuit in which the PLDMOS is used as a switch and the circuit in which the NLDMOS is used as a switch in parallel.

Figure 13:
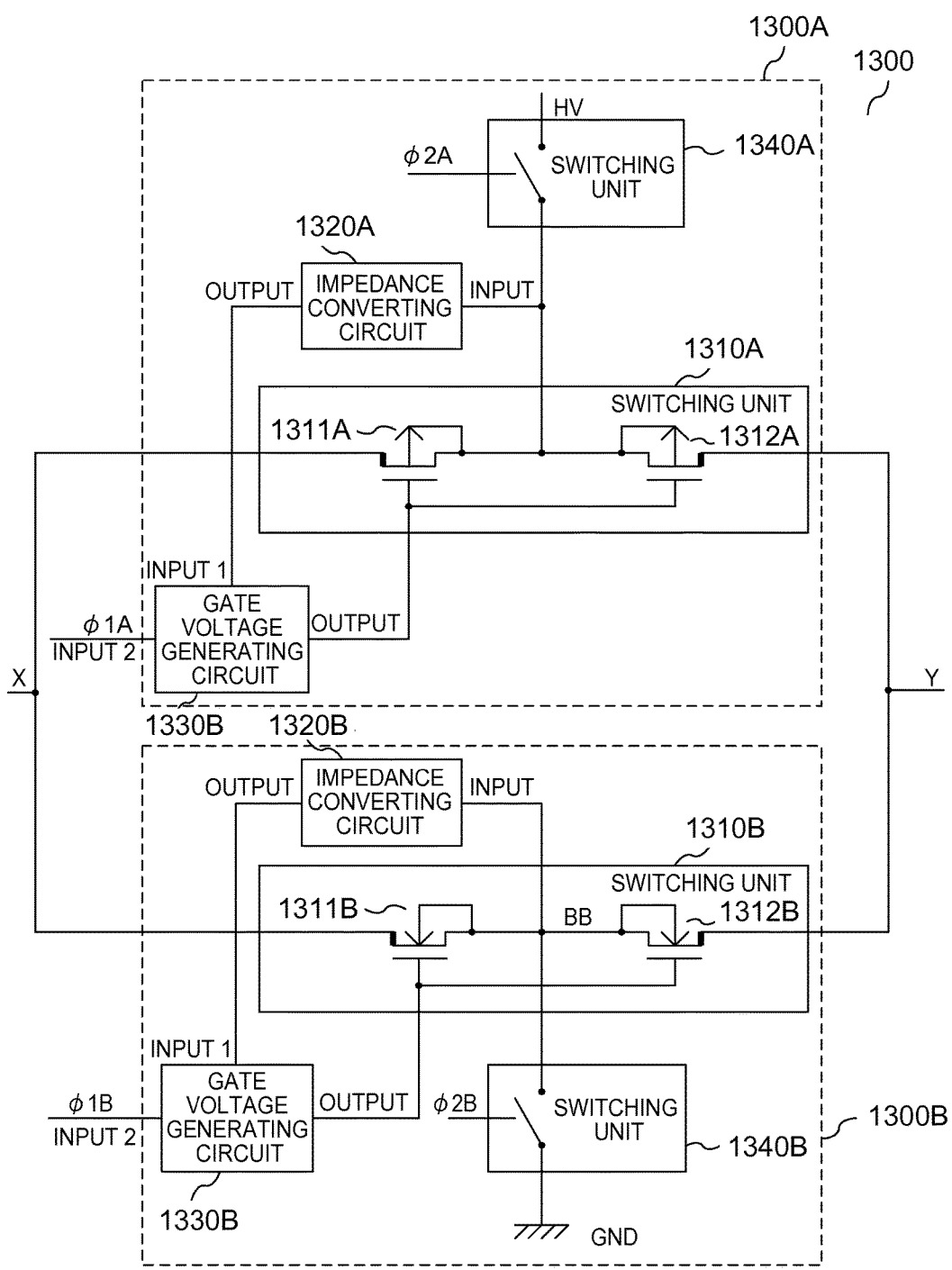
FIG. 13 is a diagram illustrating a configuration of a switching circuit according to an example embodiment.

FIG. 13 is a diagram illustrating the configuration of a switching circuit 1300 in which a switching circuit 1300A with a PLDMOS as a switch and a switching circuit 1300B with an NLDMOS as a switch are arranged in parallel between the node X and the node Y. Since the configuration of the switching circuit 1300A with the PLDMOS in the configuration illustrated in FIG. 13 is equivalent to the switching circuit 600 illustrated in FIG. 11, the description of the configuration of the switching circuit 1300A is omitted here.

The general configuration of the switching circuit 1300B with the NLDMOS, which is the same as that of the switching circuit 1300A with the PLDMOS, may include a switching unit 1310B, an impedance converting circuit 1320B, a gate voltage generating circuit 1330B, and a switching unit 1340B. Since the operations and effects obtained by the configuration are the same as those obtained by the switching circuit 600 illustrated in FIG. 11, the description thereof is omitted here.

Note that, however, the components of the switching unit 1310B are NLDMOSs 1311B and 1312B coupled in series and in reverse in a direction from the node X to the node Y. The drain of the NLDMOS 1311B is coupled to the node X and the drain of the NLDMOS 1312B is coupled to the node Y. The source and body bias of the NLDMOS 1311B and those of the NLDMOS 1312B are coupled to each other and further coupled to the input terminal of the impedance converting circuit 1320B and to the switching unit 1340B at a node BB.

The switching unit 1340B switches the on/off status of the connection according to a control signal φ2B between the node BB of the switching unit 1310B and the ground. The control signal φ2B may be the same as the control signal φ2A for switching the on/off status of the switching unit 1340A of the switching circuit 1300A. For example, a NLDMOS may be used as the switching unit 1340B.

Figure 14:
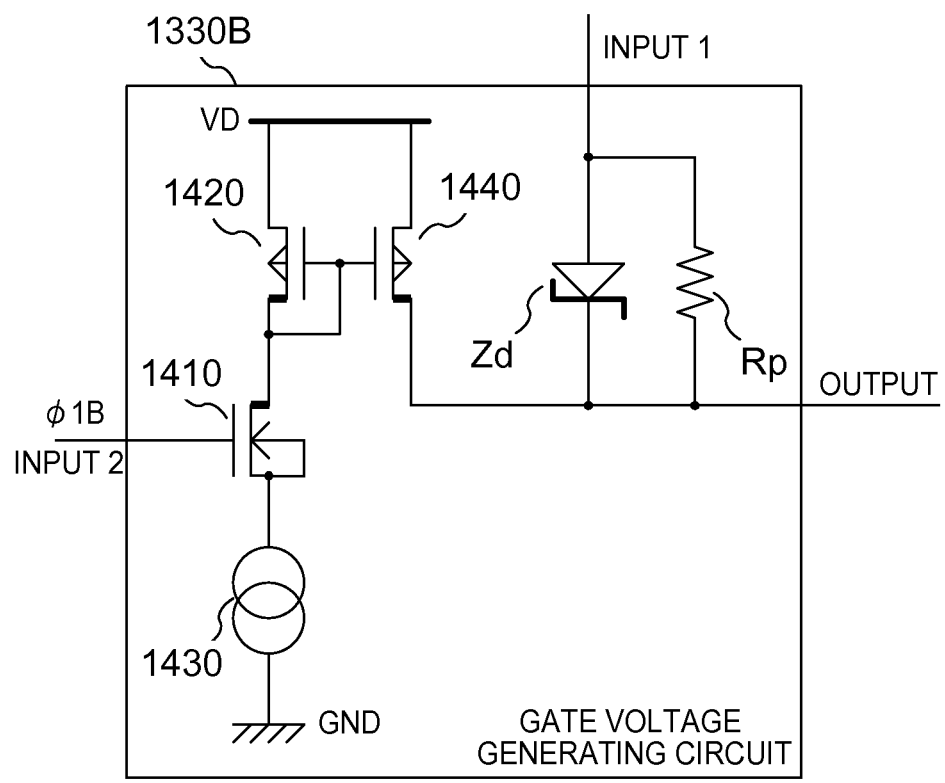
FIG. 14 is a diagram illustrating a configuration of a gate voltage generating circuit, according to an example embodiment.

According to an embodiment, a circuit configuration example of the gate voltage generating circuit 1330B of the switching circuit 1300B with an NLDMOS as a switch will be described. In the example of FIG. 14, the gate voltage generating circuit 1330B may include a zener diode Zd, a resistor Rp, PMOS transistors 1420 and 1440, an NMOS transistor 1410, and a current source 1430.

The input terminal of a gate voltage generating circuit, coupled to the output terminal of the impedance converting circuit 1320B, is coupled to the anode of the zener diode Zd and to one end of the resistor Rp. The cathode of the zener diode Zd and the other end of the resistor Rp are connected to the output terminal of the gate voltage generating circuit 1330B and to the drain of the PMOS transistor 1440.

The source of the PMOS transistor 1440 is coupled to an operating voltage VD. The gate of the PMOS transistor 1440 is coupled to the drain of the PMOS transistor 1420 and to the drain of the NMOS transistor 1410 together with the gate of the PMOS transistor 1420. The source of the PMOS transistor 1420 is coupled to the operating voltage VD.

The source of the NMOS transistor 1410 is grounded via the current source 1430. The gate of the NMOS transistor 1410 accepts an input of a control signal φ1B. The control signal φ1B may be the same as the control signal φ1A for use in switching the on/off status of the gate voltage generating circuit 1330A of the switching circuit 1300A.

According to an embodiment, a circuit configuration example of the impedance converting circuit 1320B of the switching circuit 1300B with the NLDMOS as a switch will be described. The impedance converting circuit 1320B, which may be used for a conversion from a high impedance to a low impedance, is configured to substantially inhibit current from flowing through an input terminal.

Figure 15A:
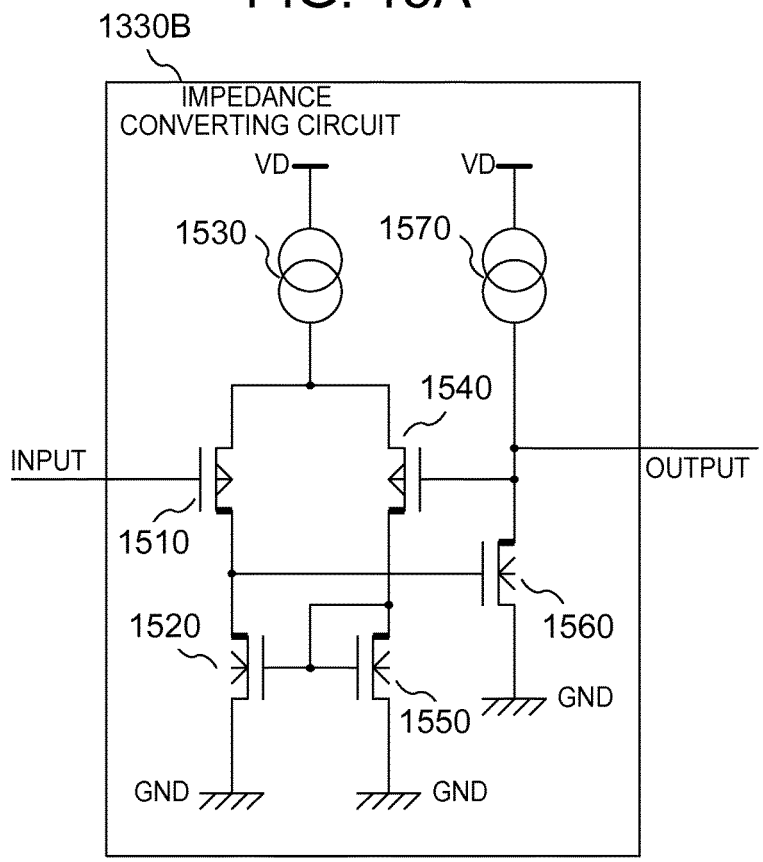
FIG. 15A is a diagram illustrating a configuration of an impedance converting circuit, according to an example embodiment.
Figure 15B:
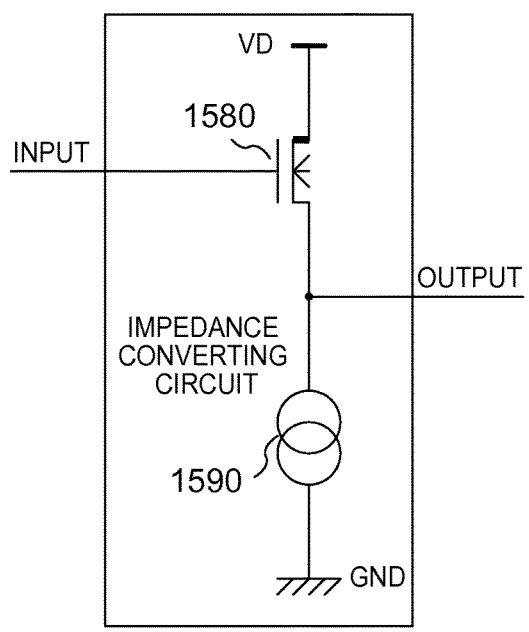
FIG. 15B is a diagram illustrating a configuration of an impedance converting circuit, according to an example embodiment.

FIG. 15A illustrates a circuit configuration where a voltage follower may be used for the impedance converting circuit 1320B and FIG. 15B illustrates a concrete circuit configuration example where a source follower may be used for the impedance converting circuit 1320B.

In the example of FIG. 15A, the impedance converting circuit 1320B may include PMOS transistors 1510 and 1540, NMOS transistors 1520, 1550, and 1560, and current sources 1530 and 1570.

The input terminal of the impedance converting circuit 1320B is coupled to the gate of the PMOS transistor 1510. The drain of the PMOS transistor 1510 is coupled to the drain of the NMOS transistor 1520 and to the gate of the NMOS transistor 1560. The source of the PMOS transistor 1510 is coupled to the operating voltage VD via the current source 1530 together with the source of the PMOS transistor 1540.

The sources of the NMOS transistors 1520 and 1550 are grounded. Moreover, the gates of the NMOS transistors 1520 and 1550 are coupled to the drains of the PMOS transistor 1540 and the NMOS transistor 1550.

The gate of the PMOS transistor 1540 is coupled to one end of the current source 1570, the output terminal of the impedance converting circuit 1320B, and the drain of the NMOS transistor 1560. The other end of the current source 1570 is coupled to the operating voltage VD and the source of the NMOS transistor 1560 is grounded.

According to an embodiment, a circuit configuration where the impedance converting circuit 1320B is implemented by using the source follower is described with reference to FIG. 15B. In the example of FIG. 15B, the impedance converting circuit 1320B may include an NMOS transistor 1580 and a current source 1590.

The input terminal of the impedance converting circuit 1320B is coupled to the gate of the NMOS transistor 1580. The drain of the NMOS transistor 1580 is coupled to the operating voltage VD. The source of the NMOS transistor 1580 is coupled to the output terminal of the impedance converting circuit 1320B and to one end of the current source 1590. The other end of the current source 1590 is grounded.

Figure 16:
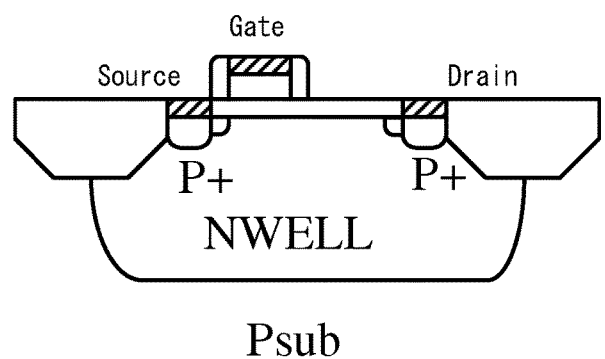
FIG. 16 is a diagram illustrating a configuration of an Offset MOSFET, according to an example embodiment.

Although the PLDMOS and the NLDMOS have been used for switches included in the switching circuits in the above description, the present invention is not limited thereto. For example, an FET which is low in the gate-source breakdown voltage such as, for example, an Offset MOSFET may be used as a switch. FIG. 16 is a diagram illustrating an example configuration of a p-channel Offset MOSFET. As shown in FIG. 16, the Offset MOSFET is a MOSFET which has a longer distance between the drain and the gate than a CMOS and thus the Offset MOS may withstand higher voltage between a drain and gate, when compared to a CMOS. The switching circuit as described in this embodiment may be used in a circuit, which has a middle breakdown voltage in the order of 5V to 100V and which requires accuracy.

4 Conclusion

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A switching circuit, comprising:
a first transistor, wherein a gate-source breakdown voltage of the first transistor is lower than a gate-drain breakdown voltage of the first transistor;
an impedance converter coupled to a source of the first transistor and configured to output an output voltage which substantially equals a source voltage of the source of the first transistor, wherein an input impedance of the impedance converter is higher than an output impedance of the impedance converter; and
a gate voltage generator configured to switch a gate voltage of the first transistor between a first voltage and a second voltage, wherein the first voltage substantially equals the output voltage, and wherein a difference between the first voltage and the second voltage is lower than the gate-source breakdown voltage.

2. The switching circuit of claim 1, wherein the first voltage switches off the first transistor, and wherein the second voltage switches on the first transistor.

3. The switching circuit of claim 1, further comprising a second transistor, wherein a source of the second transistor is coupled to the source of the first transistor and the impedance converter, and wherein the gate voltage is applied to the gate of the second transistor.

4. The switching circuit of claim 3, further comprising:
a switching unit coupled to the sources of the first and second transistors and configured to switch on when the sources of first and second transistors are coupled to an electric potential higher than a drain voltage of the first transistor, wherein the first and second transistors and the switching unit are not in a conducting status simultaneously, and wherein the first and second transistors are p-channel transistors.

5. The switching circuit of claim 3, further comprising:
a switching unit coupled to the sources of the first and second transistors and configured to switch on when the sources of first and second transistors are grounded, wherein the first and second transistors and the switching unit are not in a conducting status simultaneously, and wherein the first and second transistors are n-channel transistors.

6. The circuit of claim 3, further comprising a switching unit coupled to the sources of the first and second transistors and configured to switch on when the sources of the first and second transistors are grounded.

7. The switching circuit of claim 1, wherein the first transistor is one of a laterally diffused metal oxide semiconductor and an offset metal oxide semiconductor field effect transistor.

8. The switching circuit of claim 1, wherein the impedance converter is one of a voltage follower and a source follower.

9. The circuit of claim 1, wherein the first transistor is a laterally diffused metal oxide semiconductor.

10. The circuit of claim 1, wherein the first transistor is an offset metal oxide semiconductor field effect transistor.

11. The circuit of claim 1, wherein the impedance converter is one of a voltage follower and a source follower.

12. A switching circuit, comprising:
a first switching circuit; and
a second switching circuit, wherein the first switching circuit and the second switching circuit are coupled in parallel,
wherein the first switching circuit includes a first p-channel transistor, a second p-channel transistor, a first impedance converter, a first gate voltage generator and a first switching unit, and
wherein the second switching circuit includes a first n-channel transistor, a second n-channel transistor, a second impedance converter, a second gate voltage generator and a second switching unit,
wherein a drain of the first p-channel transistor is coupled to a drain of the first n-channel transistor and a drain of the second p-channel transistor is coupled to a drain of the second n-channel transistor.

13. The switching circuit of claim 12, wherein a source of the first p-channel transistor is coupled with a source of the second p-channel transistor.

14. The switching circuit of claim 12, wherein the first impedance converter is coupled to a source of the first p-channel transistor and a source of the second p-channel transistor and the first impedance converter is configured to output an output voltage which substantially equals a source voltage of the source of the first p-channel transistor, wherein an input impedance of the first impedance converter is higher than an output impedance of the first impedance converter.

15. The switching circuit of claim 12, wherein the first gate voltage generator configured to switch a gate voltage of the first p-channel transistor between a first voltage and a second voltage, wherein the first voltage substantially equals an output voltage of the first impedance converter, and wherein a difference between the first voltage and the second voltage is lower than a gate-source breakdown voltage of the first p-channel transistor.

16. The switching circuit of claim 12, wherein at least one of the first p-channel transistor and the first n-channel transistor is a laterally diffused metal oxide semiconductor.

17. The switching circuit of claim 12, wherein at least one of the first impedance converter and the second impedance converter is one of a voltage follower and a source follower.

18. The switching circuit of claim 12, wherein a gate-source breakdown voltage of the first p-channel transistor is lower than a gate-drain breakdown voltage of the first p-channel transistor.

19. A circuit, comprising:
 a first transistor, wherein a gate-source breakdown voltage of the first transistor is less than a gate-drain breakdown voltage of the first transistor;
 an impedance converter coupled to a source of the first transistor and configured to output an output voltage that is substantially the same as a source voltage of the source of the first transistor, wherein an input impedance of the impedance converter is greater than an output impedance of the impedance converter;
 a gate voltage generator configured to switch a gate voltage of the first transistor between a first voltage and a second voltage, wherein the first voltage is substantially the same as output voltage, and wherein a difference between the first voltage and the second voltage is less than the gate-source breakdown voltage; and
 a second transistor, wherein a source of the second transistor is coupled to the source of the first transistor and the impedance converter, and wherein the gate voltage is applied to the gate of the second transistor.

20. The circuit of claim 19, further comprising a switching unit coupled to the sources of the first and second transistors and configured to switch on when the sources of first and second transistors are coupled to an electric potential greater than a drain voltage of the first transistor.

\* \* \* \* \*